United States Patent
Többen et al.

[11] Patent Number: 6,103,456
[45] Date of Patent: Aug. 15, 2000

[54] PREVENTION OF PHOTORESIST POISONING FROM DIELECTRIC ANTIREFLECTIVE COATING IN SEMICONDUCTOR FABRICATION

[75] Inventors: Dirk Többen; Gill Yong Lee, both of Fishkill, N.Y.

[73] Assignee: Siemens Aktiengesellschaft, Munich, Germany

[21] Appl. No.: 09/120,629

[22] Filed: Jul. 22, 1998

[51] Int. Cl.⁷ ...................................................... G03F 7/00
[52] U.S. Cl. ........................... 430/317; 430/316; 430/314
[58] Field of Search .................................... 430/312, 313, 430/314, 316, 317

[56] References Cited

U.S. PATENT DOCUMENTS

| | | | |
|---|---|---|---|
| 3,884,698 | 5/1975 | Kakihama et al. | 117/217 |
| 4,491,628 | 1/1985 | Ito et al. | 430/176 |
| 4,587,138 | 5/1986 | Yau et al. | 427/88 |
| 4,820,611 | 4/1989 | Arnold, III et al. | 430/271 |
| 4,981,530 | 1/1991 | Clodgo et al. | 148/33.3 |
| 5,219,788 | 6/1993 | Abernathey et al. | 437/187 |
| 5,600,165 | 2/1997 | Tsukamoto et al. | 257/323 |
| 5,643,822 | 7/1997 | Tsukamoto | 437/195 |
| 5,674,356 | 10/1997 | Nagayama et al. | 156/659.11 |

FOREIGN PATENT DOCUMENTS

| | | |
|---|---|---|
| 0840361A | 5/1998 | European Pat. Off. . |
| 840361 | 5/1998 | European Pat. Off. . |
| 9-080755 | 3/1997 | Japan . |

Primary Examiner—Kathleen Duda
Attorney, Agent, or Firm—Donald B. Paschburg

[57] ABSTRACT

A method of forming a patterned conductive multilayer arrangement on a semiconductor substrate is provided which prevents photoresist poisoning by reactive nitrogenous substances from a silicon oxynitride layer forming a dielectric antireflective coating (DARC) for an overlying photoresist layer. The substrate has a first level conductive layer, e.g., of a metal, disposed in a region thereon, and is coated in turn with a dielectric insulation layer, e.g., of silicon dioxide, which overlies the first level conductive layer region, a dielectric antireflective coating (DARC) silicon oxynitride layer, an essentially reactive nitrogenous substance-free dielectric spacer layer, e.g., of spin-on glass (SOG), and a photoresist layer. The dielectric spacer layer prevents reactive nitrogenous substance transport therethrough from the DARC silicon oxynitride layer to the photoresist layer, thereby preventing poisoning of the photoresist layer. The photoresist layer is exposed and developed to uncover pattern portions of the dielectric spacer layer. The uncovered portions of the dielectric spacer layer and corresponding portions of the DARC silicon oxynitride layer are removed together, and then corresponding portions of the insulation layer, e.g., by a pair of tandem etching steps, to expose portions of the first level conductive layer for subsequent metallization.

18 Claims, 2 Drawing Sheets

PREVENTION OF PHOTORESIST POISONING FROM DIELECTRIC ANTIREFLECTIVE COATING IN SEMICONDUCTOR FABRICATION

FIELD OF THE INVENTION

This invention relates to semiconductor manufacture, and more particularly, to the prevention of photoresist poisoning from a dielectric antireflective coating (DARC) in semiconductor fabrication, as well as to a method of eliminating poisoning of a deep ultraviolet (DUV) photoresist layer by a silicon oxynitride (SioxNy) based DARC layer, such as in regard to forming a patterned conductive, i.e., electrically conductive, layer on a semiconductor substrate for interconnect application in semiconductor fabrication.

BACKGROUND OF THE INVENTION

In the fabrication of microelectronic semiconductor devices on a wafer substrate, such as silicon, to form an integrated circuit (IC), various metal layers and insulation layers are deposited thereon in selective sequence. The insulation layers, e.g., of silicon dioxide, silicon oxynitride ($SiO_xN_y$), fluorinated silicate glass (FSG), also called fluorinated silicon oxide, spin-on glass (SOG), etc., serve as electrical insulation between metal layers, e.g., intermetal dielectric (IMD) layers, as protective layers, as gap filling layers to achieve planarization (layer flatness) in the wafer substrate, and the like, as the case may be. The individual layers are deposited by conventional technique such as plasma enhanced chemical vapor deposition (PECVD), atmospheric pressure CVD, etc.

Typically, a first level metal layer, e.g., disposed on a silicon substrate containing devices, is separated by one or more insulation layers from a second level metal layer thereabove. This in turn may be separated by one or more further insulation layers from a third level metal layer thereabove, etc. These metal layers are interconnected by metallization through vias or small holes or apertures etched in the intervening insulation layers.

For this purpose, the stacked layers undergo photolithographic processing to provide a pattern thereon consonant with the IC design, e.g., to form vias. The top layer on the wafer substrate is covered with a photoresist layer of photo-reactive polymeric material for patterning via a mask. Light such as visible or ultraviolet (UV) light is directed through the mask onto the photoresist layer to expose it in the mask pattern. The polymeric material of the photoresist layer is transparent to the light yet photo-reactive to change its chemical properties, i.e., by photo-initiated reaction, thereby permitting its patterning.

An antireflective coating (ARC) layer such as an organic ARC layer, e.g., of light absorbing polymer, such as polyimide, is usually provided at the top portion of the wafer substrate to minimize reflection of light back to the photoresist layer for more uniform processing.

The photoresist may be of negative or positive type. In a negative photoresist, the exposed (polymerized) areas become insoluble while the unexposed (unpolymerized) areas dissolve in a later applied developer liquid. In a positive photoresist, the exposed (degraded) soluble areas dissolve in the developer liquid while the unexposed (insoluble) areas remain. In both instances, the photoresist material remaining on the wafer substrate forms the pattern to serve as a mask for etching in turn of the pertinent layers. Where a layer material is of different physical and chemical characteristics from that of adjacent layers, its etching process is also different therefrom, e.g., in forming vias in dielectric layers to connect neighboring level metal layers. The etching is desirably anisotropic (high rate vertical direction etching and low rate or inhibited horizontal direction etching), as distinguished from isotropic (etching the exposed surfaces equally in all directions), for providing an etched structure of uniform vertical wall geometry or profile. Etching may be effected by wet etching (solution) or dry etching (plasma etching or reactive ion etching) technique, depending on the physical and chemical characteristics of the material being etched and of the neighboring material.

For maximizing the integration (connection) of device components in the available area on the wafer substrate to fit more components in the same area, increasing miniaturization is required. As narrower metal lines and closer pitch dimensions are needed to achieve increasingly dense packing of the components, they become more vulnerable to defects at the minute tolerances involved. This has become apparent as IC miniaturization has increased to what is now called very large scale integration (VLSI) at sub-quarter micron (0.25 micron, i.e., 250 nanometer (nm) or 2,500 angstrom) dimensions.

By comparison, visible light has a wavelength spectrum of 400–700 nm (4,000–7,000 angstroms), and UV light has a wavelength spectrum of 100–400 nm (1,000–4,000 angstroms). Generally, mid UV (MUV) light has a wavelength of about 365 nm, while deep UV (DUV) light has a wavelength of about 248 nm or less.

At sub-quarter micron sizes, the desired high aspect ratios (depth to width) associated with photolithographic processing to form apertures or windows, fine conductive lines, etc., in various layers of the wafer substrate, require very strict tolerances to prevent undesired defects such as touching of closely spaced apart components that can cause short circuiting, etc.

During travel of the mask patterned incident light from the radiation source through the photo-reactive polymeric material of the photoresist layer, it is progressively absorbed as it photo-initiates reaction in the exposed pattern areas. As some incident light reaching the ARC layer is not absorbed thereby, but rather is reflected and scattered back into the photoresist layer, there is interference with the incident light and formation of standing waves.

Contaminants that are incompatible with the photo-reactive polymeric material can migrate into the photoresist layer from the ARC layer or other vicinal layer. These contaminants can poison the photoresist layer, e.g., undergo interfering reactions therewith, causing non-uniformity of the reaction therein by extraneous chemical interaction with the polymeric material. This is commonly called photoresist poisoning and leads to the formation of a photoresist footing where a positive photoresist is used, or to a photoresist pinching where a negative photoresist is used.

Specifically, upon development, the exposed pattern areas of the photoresist layer have a photoresist profile or structure with non-uniform (non-vertical) side walls. After etching, the photoresist footing or photoresist pinching problem leads to imperfect transfer of the photoresist pattern to the underlying layer or layers, and ultimately limits the minimum spatial resolution since the etched structure is imprecise compared to the desired IC design.

Some examples of the fabrication of semiconductor devices are shown in the following prior art.

[1] U.S. Pat. No. 3,884,698 (Kakihama et al.), issued May 20, 1975, discloses a semiconductor substrate having in turn an insulation layer, an opaque metal ARC layer, and a photoresist layer. The metal ARC layer absorbs most of the incident light so that only a small part reflects back to the photoresist layer. The problem involved is that interference between incident and reflected light in the photoresist produces standing waves with minimum exposure nodes and maximum exposure antinodes. Light of an intensity for correct antinode exposure causes node underexposure, so that upon development the photoresist pattern is not completely open for accurate etching of underlying layers. Conversely, light of increased intensity for node exposure and complete opening of the pattern, causes antinode overexposure and poor pattern definition. This is alleviated by choosing the insulation and metal ARC layer thicknesses so as to cancel the reflected light, suppress the interference and reduce the standing wave amplitude.

[2] U.S. Pat. No. 4,491,628 (Ito et al.), issued Jan. 1, 1985, discloses a positive or negative photoresist, depending on the developer, for deep UV photolithography to attain nearly vertical walls. It is formed from a polymer with acid groups that undergo acidolysis causing changes in polarity (solubility) of the exposed and unexposed regions, a photo-initiator that generates acid upon radiolysis, and a sensitizer, e.g., a dye, that absorbs radiation to alter the sensitivity of the photo-initiator.

[3] U.S. Pat. No. 4,587,138 (Yau et al.), issued May 6, 1986, discloses a semiconductor substrate having in turn an insulation layer, an aluminum layer, a dye-containing SOG layer wherein the dye causes the SOG layer to function as an ARC layer, and a photoresist layer. The dye-containing SOG ARC layer permits antireflective photolithographic patterning as well as alloying and hermetic passivation at temperatures above 200° C. while inhibiting formation of surface hillocks and internal voids in the aluminum layer. In the passivation step, a silicon oxynitride hermetically sealing layer is added. The dye-containing SOG ARC has the advantage over an organic, e.g., polyimide, ARC, that if the photoresist process must be reworked, only the photoresist is stripped and not the SOG ARC.

[4] U.S. Pat. No. 4,820,611 (Arnold, III et al.), issued Apr. 11, 1989, discloses the reducing of reflected light from a metal layer on an IC structure back to a photoresist layer during photolithographic patterning, by placing a TiN (titanium nitride) ARC layer between the metal and photoresist layers. The TiN ARC layer thickness depends on the radiation wavelength and metal layer optical properties to reduce standing wave interference due to light reflection and scattering. TiN ARC use is distinguished from metal or refractory ARC use and from organic, e.g., dye-containing polyimide, ARC use.

[5] U.S. Pat. No. 4,981,530 (Clodgo et al.), issued Jan. 1, 1991, discloses the use of SOG for an organic insulation layer on a semiconductor substrate. Water is reacted with an amino alkoxy silane in a solvent, and the resulting solution is aged, spin coated on the substrate and cured in an oxygen-free, inert nitrogen atmosphere to a ladder type silsesquioxane polymer. This SOG material is distinguished from known organic insulation layer materials such as polyimide resins which exhibit poor planarizing characteristics and polysiloxanes which show stress-induced cracking and poor adhesion.

[6] U.S. Pat. No. 5,219,788 (Abernathey et al.), issued Jun. 15, 1993, refers to the five above discussed U.S. Pat. No. [1] 3,884,698 (Kakihama et al.), U.S. Pat. No. [2] 4,491,628 (Ito et al.), U.S. Pat. No. [3] 4,587,138 (Yau et al.), U.S. Pat. No. [4] 4,820,611 (Arnold, III et al.), and U.S. Pat. No. [5] 4,981,530 (Clodgo et al). It discloses a semiconductor substrate having in turn a metal bilayer of Ti and Al/Cu/Si, a TiN ARC layer, a silicon-containing barrier layer of Si, $SiO_2$ or SOG, and a deep UV photoresist layer for high density photolithographic patterning with reduced line width and pitch of device components, while avoiding photoresist webbing (photoresist footing) formation.

In [6] U.S. Pat. No. 5,219,788 (Abernathey et al.), the photoresist is of the type that generates acid groups on exposure per said [2] U.S. Pat. No. 4,491,628 (Ito et al.). When the barrier layer is formed of SOG, it can be applied to the TiN ARC layer per said [5] U.S. Pat. No. 4,981,530 (Clodgo et al.). The barrier layer prevents interaction between the TiN of the ARC layer and acid groups of the photoresist layer. The TiN ARC layer provides adhesion for the barrier layer and prevents silicon transport from the barrier layer to the metal bilayer during high pressure processing. During patterning, of course, the TiN ARC layer suppresses light reflection back to the photoresist.

DARC (dielectric antireflective coating) layers, particularly those based on silicon oxynitride, have multiple advantages at several mask levels in the semiconductor fabrication. They can be used in destructive interference and absorption modes and their composition and properties can be well controlled during the deposition process. In some applications, they can also be employed as hard masks in the etch process following a given photolithographic step. It is expected that they will at least partially replace organic spin-on ARC materials in the near future.

A disadvantage of silicon oxynitride films (layers) lies in their incompatibility with modern DUV (deep UV) photoresist systems due to reactive contaminants that are present therein, i.e., reactive nitrogenous substances (including reactive nitrogen itself and attendant self-generating reactive functional group-containing contaminant compounds thereof with other contaminating precursor constituents). These reactive nitrogenous substances tend to migrate or diffuse out of the silicon oxynitride layer and chemically interact with constituents of the polymeric material of the photoresist layer.

As earlier noted, such chemical interaction, commonly called photoresist poisoning, leads to photoresist footing or photoresist pinching, i.e., non-uniform side walls of the photoresist profile on the underlying substrate after the photolithographic exposure and development process has been performed. The photoresist footing or photoresist pinching problem leads to imperfect transfer of the photoresist pattern to the underlying substrate and ultimately limits the minimum spatial resolution of IC components.

Therefore, a conventional silicon dioxide cap layer is usually deposited on the silicon oxynitride layer as a spacer layer to minimize reactive nitrogenous substance out-diffusion. However, this silicon dioxide cap layer is typically also deposited with a reactive nitrogen-containing species, such as by PECVD technique using silane ($SiH_4$) with oxygen and nitrogen or nitrous oxide ($N_2O$), and/or remaining nitrogen may diffuse from the silicon oxynitride layer into the silicon dioxide cap layer. Both effects can again cause the above described poisoning phenomena.

While the matter is not fully understood at this time, it is believed that reactive contaminants such as hydrogen and nitrogen remain as precursor constituents in silicon dioxide based layers consequent their deposition, e.g., by PECVD technique, using silane ($SiH_4$) with nitrous oxide, and the like. In the presence of such reactive nitrogen, it is considered that self-generating reactive contaminant compounds thereof, such as amines, are formed with attendant hydrogen and/or other species that remain as contaminating precursor constituents. It is believed that such reactive nitrogen and such self-generating reactive contaminant compounds out-diffuse to collect at the interface with the overlying photoresist layer to cause such poisoning problems.

As used in the specification and claims, the term "reactive nitrogenous substance" contemplates reactive nitrogen-containing substances including both reactive nitrogen itself and attendant self-generating reactive contaminant compounds thereof with other contaminating precursor constituents such as hydrogen (i.e., reactive nitrogen-containing contaminant compounds).

A typical prior art fabrication technique for forming a patterned conductive multilayer arrangement on a semiconductor substrate, which involves a dual damascene metallization scheme using a conventional organic ARC, includes the following steps:

(1) depositing an intermetal dielectric (IMD) insulation layer, e.g., of silicon dioxide, on an underlying semiconductor wafer substrate having a first level conductive layer, e.g., of metal, thereon, and then depositing a first organic ARC layer on the insulation layer and a first photoresist layer on the organic ARC layer, followed by patterning (photolithographic exposure and development) to open a contact hole (aperture) in the photoresist layer;

(2) subjecting the organic ARC layer to an open etch to deepen the aperture and expose the underlying insulation layer, whereby the aperture pattern in the photoresist layer is widened due to the non-selectivity of the open etch process;

(3) subjecting the insulation layer to dielectric etching, using the photoresist layer as a mask, to deepen the widened aperture and form a via exposing the underlying first level conductive layer, and then stripping the photoresist layer and organic ARC layer;

(4) depositing a second organic ARC layer on the insulation layer, whereby the via becomes filled with residual organic ARC material, and then depositing a second photoresist layer on the organic ARC layer, followed by patterning (photolithographic exposure and development) to open an interconnect trench in the photoresist layer surrounding the via;

(5) subjecting the organic ARC layer to an open etch to deepen the trench and expose the underlying insulation layer, while also removing the upper portion of the residual organic ARC material that fills the via in the insulation layer, whereby the trench pattern in the photoresist layer is widened due to the non-selectivity of the open etch process;

(6) subjecting the insulation layer to dielectric etching to deepen the trench further and form a corresponding trench in the insulation layer, which leaves fences surrounding the via because of the interfering presence of residual organic ARC material in the via, and then stripping the photoresist layer and organic ARC layer;

(7) wet cleaning the insulation layer, and depositing a second level conductive layer, e.g., of metal, on the insulation layer to overfill the via and trench pattern created therein and form a conductive contact with the first level conductive layer exposed at the via; and (8) subjecting the second level conductive layer to chemical mechanical polishing (CMP) to remove surplus conductive material and expose the surface of the insulation layer typically with some overpolishing.

It is clear from the foregoing that the organic ARC open etching leads to width control problems and that the fences left in the insulation layer may lead to the formation of voids in the conductive layer and consequent reliability problems.

It is desirable to have an arrangement of silicon oxynitride as a DARC layer for a photoresist layer during fabrication of a semiconductor device which prevents out-diffusion of reactive nitrogenous substances so as to avoid poisoning the photoresist layer and consequent photoresist footing or photoresist pinching problems causing imperfect pattern transfer into the underlying substrate that limits the minimum spatial resolution of components on the device, especially if this is attained while reducing the manufacturing costs.

SUMMARY OF THE INVENTION

The foregoing drawbacks are obviated in accordance with the present invention by providing a system of a silicon oxynitride layer as a dielectric antireflective coating (DARC) layer for an overlying deep UV (DUV) photoresist layer in semiconductor fabrication, in which a thin layer of essentially reactive nitrogenous substance-free dielectric material is interposed as a dielectric spacer layer therebetween.

The intervening reactive nitrogenous substance-free dielectric spacer layer eliminates poisoning of the DUV photoresist layer by the DARC silicon oxynitride layer. The dielectric spacer layer is desirably formed of silicon dioxide based material such as that provided by spin-depositing a thin layer of spin-on glass (SOG) on the DARC silicon oxynitride layer so as to prevent DUV photoresist poisoning. Both the SOG and the photoresist layer polymeric material can be advantageously applied in sequence on the same tool (track) in an integrated fashion since the photoresist material is commonly applied by spin-on technique in conventional semiconductor fabrication. This effectively reduces the manufacturing cost.

According to the invention, a method is provided for forming a patterned conductive multilayer arrangement on a semiconductor substrate. It comprises providing a dielectric insulation layer, e.g., of silicon dioxide, on a surface of a semiconductor substrate having a first conductive layer, e.g., of metal, disposed in a selective region thereon such that the insulation layer overlies the region of the first conductive layer. It further comprises providing a silicon oxynitride layer on the insulation layer sufficiently to form a dielectric antireflective coating (DARC) thereon, and then an essentially reactive nitrogenous substance-free dielectric spacer layer on the DARC silicon oxynitride layer sufficiently to prevent reactive nitrogenous substance transport therethrough from the DARC silicon oxynitride layer. A photoresist layer is provided on the dielectric spacer layer.

The photoresist layer is selectively exposed and developed to uncover selective pattern portions of the underlying dielectric spacer layer. The uncovered pattern portions of the dielectric spacer layer are in overlying aligned relation to the first conductive layer region in the substrate. These pattern portions of the dielectric spacer layer and corresponding underlying portions of the DARC silicon oxynitride layer are removed to uncover corresponding portions of the underlying insulation layer. The uncovered portions of the insulation layer are removed to uncover the region of the first conductive layer.

In particular, the dielectric spacer layer is formed of essentially reactive nitrogenous substance-free silicon dioxide material, such as essentially reactive nitrogenous substance-free spin-on glass, and the photoresist layer is formed of an organic photoresist material susceptible to reactive nitrogenous substance poisoning.

Conveniently, the uncovered pattern portions of the dielectric spacer layer and corresponding underlying portions of the DARC silicon oxynitride layer are removed together in a first etching step in a chamber zone, and the uncovered portions of the insulation layer are removed in a second etching step immediately following the first etching step in the same chamber zone. The first and second etching steps are desirably performed by reactive ion etching (RIE), e.g., using a fluorine containing chemistry.

The method further includes removing the remainder of the developed photoresist layer to expose the dielectric spacer layer, and providing a further photoresist layer on the dielectric spacer layer and in surrounding relation to the previously removed pattern portions of the dielectric spacer layer. The further photoresist layer is selectively exposed and developed to uncover widened pattern portions surrounding the previously removed pattern portions of the dielectric spacer layer.

Then, the uncovered widened pattern portions of the dielectric spacer layer, corresponding underlying portions of the DARC silicon oxynitride layer, and upper course portions of the underlying widened portions of the insulation layer that surround the previously uncovered first conductive layer region, are removed. Lastly, a second conductive layer, e.g., of a metal, is provided on the widened pattern portions of the insulation layer and in conductive contact with the previously uncovered pattern portions of the first conductive layer region.

Typically, the insulation layer is provided in a thickness of about 5,000–10,000 angstroms, the DARC silicon oxynitride layer is provided in a thickness of about 300–1,500 angstroms, and the dielectric spacer layer is provided in a thickness of about 250–1,000 angstroms.

Significantly, the dielectric spacer layer and the photoresist layer may be provided by deposition in sequence onto the antireflective coating silicon oxynitride layer in the same deposition zone.

According to a preferred feature of the invention, the method comprises the steps of treating a wafer substrate in semiconductor fabrication for inhibiting reactive nitrogenous substance flow from a silicon oxynitride layer forming a DARC thereon to an overlying photoresist layer to prevent reactive nitrogenous substance poisoning of the photoresist layer. The method comprises interposing an essentially reactive nitrogenous substance-free dielectric spacer layer between the DARC silicon oxynitride layer and the overlying photoresist layer sufficiently to prevent reactive nitrogenous substance transport therethrough from the DARC silicon oxynitride layer to the photoresist layer.

The present invention also contemplates the product thereby produced.

The invention will be more readily understood from the following detailed description taken with the accompanying drawings and claims.

BRIEF DESCRIPTION OF THE DRAWINGS

It is noted that the drawings are not to scale, some portions being shown exaggerated to make the drawings easier to understand.

DETAILED DESCRIPTION

Referring now to FIGS. 1A to 1H, there are shown eight stages of fabrication of a PRIOR ART semiconductor device or microchip 20 having variously a wafer substrate 21, a first level conductive layer 22, an IMD (intermetal dielectric) insulation layer 23, an insulation layer polished top surface 23a, a first organic ARC (antireflective coating) layer 24, a first photoresist layer 25, e.g., of positive photoresist material, a contact hole (aperture) 26, a deepened and widened contact hole 26a, a via (aperture) 27, a second organic ARC layer 28, a second photoresist layer 29, e.g., of positive photoresist material, an interconnect trench 30, a widened trench 30a, a via trench 31, fences 32, a second level conductive layer 33, and a second level conductive layer polished top surface 33a.

FIGS. 1A to 1H illustrate a typical PRIOR ART method sequence of steps for forming a patterned conductive multilayer arrangement on a semiconductor substrate, which involves a dual damascene metallization scheme using a conventional organic ARC.

Figure 1A:
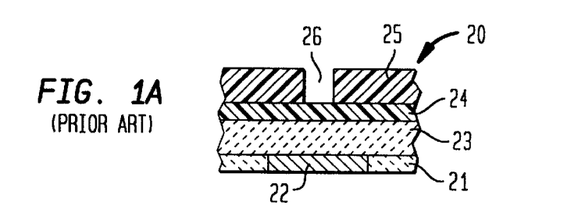
FIGS. 1A to 1H are a series of vertical cross sectional views illustrating stages in forming a patterned conductive multilayer arrangement on a semiconductor substrate in accordance with the PRIOR ART.

FIG. 1A shows semiconductor device or microchip 20 having a wafer substrate 21, e.g., of silicon, on which a first level conductive layer 22, e.g., of a metal such as tungsten, has been deposited in a selective region thereon, and in turn an IMD insulation layer 23, e.g., of silicon dioxide, a first organic ARC layer 24, and a first photoresist layer 25, e.g., of positive photoresist material. This is followed by patterning (photolithographic exposure and development) to open contact hole 26 to expose the underlying pattern area of first organic ARC layer 24.

This is the condition of semiconductor device 20 after the combination step (1) of depositing an insulation layer on a substrate having a first level conductive layer thereon, depositing a first organic ARC layer on the insulation layer, depositing a first photoresist layer on the organic ARC layer, and patterning the photoresist layer to open a contact hole therein.

Figure 1B:
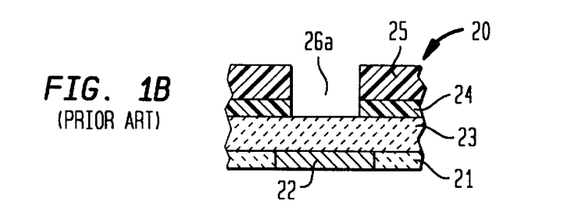

FIG. 1B shows semiconductor device 20 after open etching of organic ARC layer 24, which provides a deepened, yet widened, contact hole 26a through organic ARC layer 24 to expose the underlying pattern area of insulation layer 23. Contact hole 26a is widened relative to contact hole 26 due to the non-selectivity of the ARC open etch process. This is the condition of semiconductor device 20 after the step (2) of open etching of the first organic ARC layer to deepen the aperture and expose the underlying insulation layer, whereby the aperture pattern is widened due to etching non-selectivity.

Figure 1C:
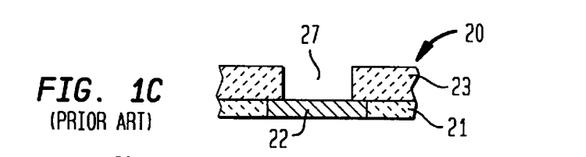

FIG. 1C shows semiconductor device 20 after etching of insulation layer 23, using photoresist layer 25 as a mask, which deepens widened aperture 26a to provide via 27 in insulation layer 23 to expose the underlying region of first level conductive layer 22. This is followed by stripping of photoresist layer 25 and organic ARC layer 24. This is the condition of semiconductor device 20 after the combination step (3) of etching the insulation layer, using the photoresist layer as a mask, to deepen the widened aperture and form a via exposing the underlying first level conductive layer, and then stripping the photoresist layer and organic ARC layer.

Figure 1D:
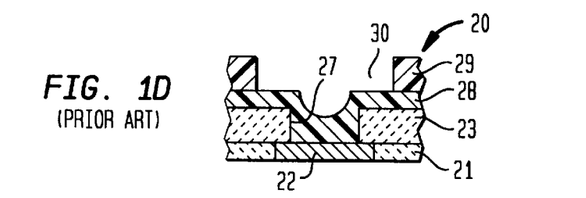

FIG. 1D shows semiconductor device 20 after applying second organic ARC layer 28 on insulation layer 23, which causes via 27 to be filled up with residual organic ARC layer material, and in turn applying second photoresist layer 29, e.g., of positive photoresist material, on organic ARC layer 28. This is followed by patterning (photolithographic exposure and development) of photoresist layer 29 to open interconnect trench 30 therein which surrounds via 27. This is the condition of semiconductor device 20 after the combination step (4) of depositing a second organic ARC layer on the insulation layer, whereby the via becomes filled with residual organic ARC material, and depositing a second photoresist layer on the organic ARC layer, followed by patterning to open an interconnect trench in the photoresist layer surrounding the via.

Figure 1E:
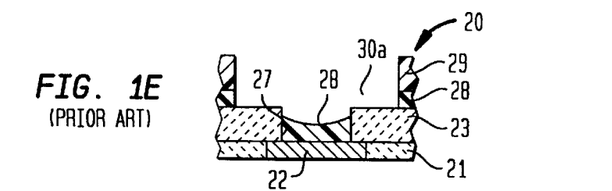

FIG. 1E shows semiconductor device 20 after open etching of organic ARC layer 28, which provides a deepened, yet widened, trench 30a through organic ARC layer 28 to expose the underlying pattern area of insulation layer 23. Trench 30a is widened relative to trench 30 due to the non-selectivity of the organic ARC etch process. The body of residual organic ARC material in via 27 is recessed but not completely removed by the organic ARC etch process. This is the condition of semiconductor device 20 after the step (5) of open etching of the second organic ARC layer to deepen the trench and expose the underlying insulation layer, while also removing the upper portion of the residual organic ARC material filling the via in the insulation layer, whereby the trench pattern in the photoresist layer is widened due to etching non-selectivity.

Figure 1F:
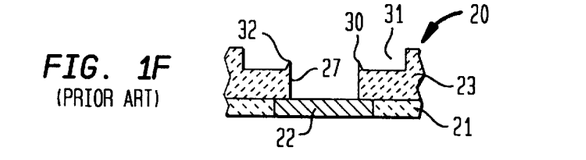
Figure 1G:
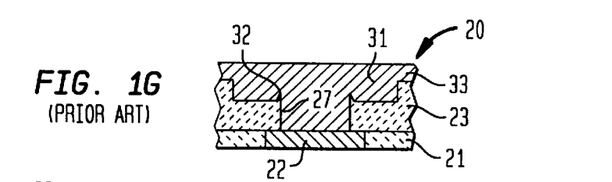

FIG. 1F shows semiconductor device 20 after etching insulation layer 23 to a desired depth to form via trench 31 which extends the pattern of trench 30a into the upper portion of insulation layer 23, followed by stripping of photoresist layer 29 and organic ARC layer 28. Because of the presence of residual organic ARC material in via 27, fences 32 are left in insulation layer 23 at the center portion of via trench 31 which surrounds via 27. This is the condition of semiconductor device 20 after the combination step (6) of etching the insulation layer to deepen the organic ARC layer trench further and form a corresponding trench in the insulation layer, which leaves fences surrounding the via because of the interfering presence of residual organic ARC material in the via, and then stripping the photoresist layer and organic ARC layer, FIG. 1G shows semiconductor device 20 after wet cleaning insulation layer 23, followed by deposition of second level conductive layer 33, e.g., of a metal such as aluminum, on insulation layer 23 which overfills via trench 31 created therein and forms a conductive contact with first level conductive layer 22. This is the condition of semiconductor device 20 after the combination step (7) of wet cleaning the insulation layer, and depositing a second level conductive layer thereon to overfill the via and trench pattern created therein and form a conductive contact with the first level conductive layer exposed at the via.

Figure 1H:
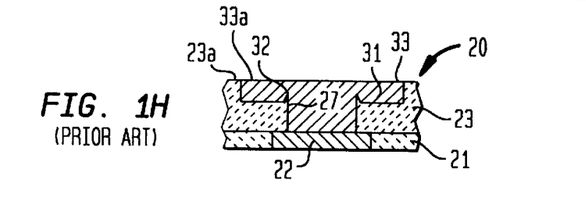

Lastly, FIG. 1H shows semiconductor device 20 after chemical mechanical polishing (CMP) of surplus second level conductive material from second level conductive layer 33 back down to the level of insulation layer 23 to form polished top surface 23a on insulation layer 23 and polished top surface 33a on second level conductive layer 33 in flush relation to each other, e.g., with some overpolishing at such top surfaces. This is the condition of semiconductor device 20 after the final step (8) of effecting CMP of the second level conductive layer to remove surplus conductive material and expose the surface of the insulation layer typically with some overpolishing.

The steps of providing first level conductive layer 22 on wafer substrate 21, depositing insulation layer 23 on wafer substrate 21, applying organic ARC layer 24 on insulation layer 23, applying photoresist layer 25 on organic ARC layer 24, patterning photoresist layer 25, etching organic ARC layer 24, and etching insulation layer 23, are effected by conventional technique. The further steps of stripping photoresist layer 25 and organic ARC layer 24 from insulation layer 23, applying organic ARC layer 28 to insulation layer 23, applying photoresist layer 29 to organic ARC layer 28, patterning photoresist layer 29, etching organic ARC layer 28, again etching insulation layer 23, stripping photoresist layer 29 and organic ARC layer 28, wet cleaning insulation layer 23, depositing second level conductive layer 33 on insulation layer 23, and chemically mechanically polishing insulation layer 23 and second level conductive layer 33, are also effected by conventional technique.

The above discussed prior art scheme using a conventional organic ARC layer suffers from the serious disadvantage that the open etching of the organic ARC layer leads to width control problems in providing contact holes, trenches, vias, and the like. This is due to the undesired pronounced increase in width dimensions of such etched areas, which fosters the creation of trench fences in surrounding relation to vias and the like that lead to the formation of local voids in neighboring conductive layers. This is because the individual organic ARC layers 24 and 28 cannot be etched by the etch needed to etch dielectric insulation layer 23. Conversely, dielectric insulation layer 23 cannot be etched by the etch needed to etch each of organic ARC layers 24 and 28. As demonstrated below, these prior art drawbacks are overcome by the system of the present invention.

According to the invention, the corresponding fabrication technique for forming a patterned conductive multilayer arrangement on a semiconductor substrate, which involves a dual damascene metallization scheme using a DARC silicon oxynitride/SOG system, contemplates the following analogous steps:

[1] providing a dielectric insulation layer on a surface of a semiconductor substrate having a first conductive layer disposed in a selective region thereon such that the insulation layer overlies the region of the first conductive layer;

[2] providing a silicon oxynitride layer on the insulating layer sufficiently to form a DARC (dielectric antireflective coating) thereon;

[3] providing an essentially reactive nitrogenous substance-free dielectric spacer layer on the DARC silicon oxynitride layer sufficiently to prevent reactive nitrogenous substance transport therethrough from the DARC silicon oxynitride layer;

[4] providing a photoresist layer on the dielectric spacer layer;

[5] selectively exposing and developing the photoresist layer to uncover selective pattern portions of the underlying dielectric spacer layer, which pattern portions are in overlying aligned relation to the first conductive layer region in the substrate;

[6] removing the uncovered pattern portions of the dielectric spacer layer and corresponding underlying portions of the DARC silicon oxynitride layer for uncovering corresponding portions of the underlying insulation layer; and

[7] removing the uncovered portions of the insulation layer to uncover the region of the first conductive layer in the substrate.

Further steps include:

[8] removing the remainder of the developed photoresist layer to expose the dielectric spacer layer;

[9] providing a further photoresist layer on the dielectric spacer layer and in surrounding relation to the previously removed pattern portions of the dielectric spacer layer;

[10] selectively exposing and developing the further photoresist layer to uncover widened pattern portions surrounding the previously removed pattern portions of the dielectric spacer layer;

[11] removing the uncovered widened pattern portions of the dielectric spacer layer and corresponding underlying portions of the DARC silicon oxynitride layer and upper course portions of the underlying widened portions of the insulation layer surrounding the previously uncovered first conductive layer region; and

[12] providing a second conductive layer on the widened pattern portions of the insulation layer and in conductive contact with the previously uncovered pattern portions of the first conductive layer region.

Referring now to FIGS. 2A to 2G, there are shown seven stages of fabrication of a semiconductor device or microchip 40 according to an embodiment of the invention, having variously a wafer substrate 21', a first level conductive layer 22', an IMD (intermetal dielectric) insulation layer 23', a DARC (dielectric antireflective coating) silicon oxynitride layer 41, a DARC silicon oxynitride layer polished top surface 41a, an essentially reactive nitrogenous substance-free dielectric spacer layer 42, a first photoresist layer 25', e.g., of positive photoresist material, a contact hole (aperture) 43, a deepened contact hole 43a, a via (aperture) 44, a second photoresist layer 45, e.g., of positive photoresist material, an interconnect trench 46, a via trench 47, a second level conductive layer 48, and a second level conductive layer polished top surface 48a.

In FIGS. 2A to 2G, parts designated by prime (') numbers are the same as those in FIGS. 1A to 1H.

FIGS. 2A to 2G illustrate a method sequence of steps for forming a patterned conductive multilayer arrangement on a semiconductor substrate, using silicon oxynitride as a DARC layer and an essentially reactive nitrogenous substance-free dielectric spacer layer between the DARC silicon oxynitride layer and an overlying photoresist layer.

Figure 2A:
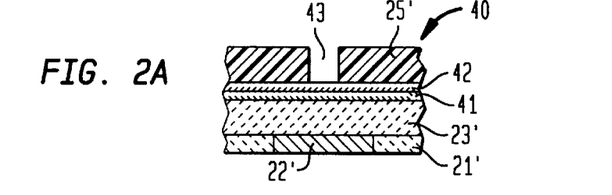
FIGS. 2A to 2G are a series of similar vertical cross sectional views illustrating stages in forming a patterned conductive multilayer arrangement on a semiconductor substrate in accordance with an embodiment of the invention.

FIG. 2A shows semiconductor device or microchip 40 having a wafer substrate 21', e.g., of silicon, on which a first level conductive layer 22', e.g., of a metal such as tungsten, has been deposited in a selective region thereon, and in turn an IMD insulation layer 23', e.g., of silicon dioxide, a silicon oxynitride layer 41 forming a DARC (dielectric antireflective coating), an essentially reactive nitrogenous substance-free dielectric spacer layer 42 which prevents photoresist poisoning, and a first photoresist layer 25', e.g., of positive photoresist material. This is followed by patterning (photolithographic exposure and development) to open contact hole 43 to expose the underlying pattern area of dielectric spacer layer 42. The thickness of insulation layer 23' may be reduced to compensate for the inclusion of DARC silicon oxynitride layer 41 and dielectric spacer layer 42 in the layer stack.

This is the condition of semiconductor device 40 after steps [1] to [5] of depositing a dielectric insulation layer on a semiconductor substrate having a first conductive layer in a region thereon such that the insulation layer overlies the first conductive layer region, depositing a DARC silicon oxynitride layer on the insulating layer, depositing an essentially reactive nitrogenous substance-free dielectric spacer layer on the DARC silicon oxynitride layer, applying a photoresist layer on the dielectric spacer layer, and exposing and developing the photoresist layer to uncover pattern portions of the dielectric spacer layer, which pattern portions are in overlying aligned relation to the first conductive layer region in the substrate.

Figure 2B:
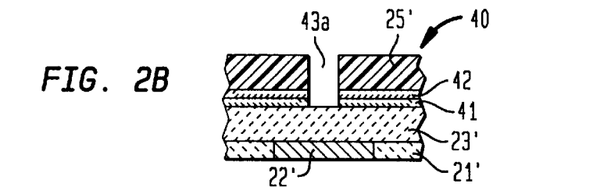

FIG. 2B shows semiconductor device 40 after etching dielectric spacer layer 42 and DARC silicon oxynitride layer 41, which provides a deepened, yet unwidened, contact hole 43a through dielectric spacer layer 42 and DARC silicon oxynitride layer 41 to expose the underlying pattern area of insulation layer 23'. Contact hole 43a is not widened relative to contact hole 43 due to the selectivity of the dielectric etch process involved. This is the condition of semiconductor device 40 after the step [6] of removing the uncovered pattern portions of the dielectric spacer layer and corresponding underlying portions of the DARC silicon oxynitride layer to uncover corresponding portions of the insulation layer.

Figure 2C:
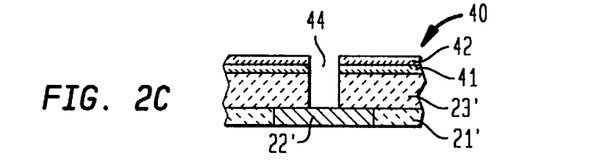

FIG. 2C shows semiconductor device 40 after dielectric etching of insulation layer 23', using dielectric spacer layer 42 as a mask, which deepens unwidened contact hole 43a to provide via 44 in insulation layer 23' for exposing the underlying region of first level conductive layer 22'. This is followed by stripping of photoresist layer 25'. The etching operation to form via 44 is advantageously performed within the same chamber zone, i.e., etching chamber, as the etching operation used to form deepened contact hole 43a, i.e. wafer substrate 21' remains in the same etch chamber for a tandem pair of etching operations. This is the condition of semiconductor device 40 after the steps [7] to [8] of removing the uncovered portions of the insulation layer to uncover the region of the first conductive layer in the substrate, and then stripping the photoresist layer to expose the dielectric spacer layer.

Figure 2D:
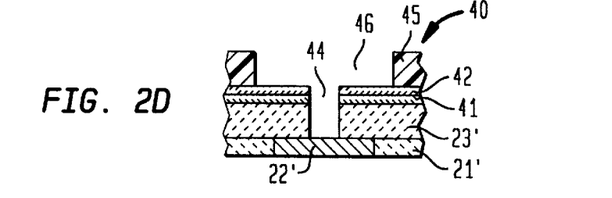

FIG. 2D shows semiconductor device 40 after applying second photoresist layer 45, e.g., of positive photoresist material, on dielectric spacer layer 42, and patterning (photolithographic exposure and development) of photoresist layer 45 to open interconnect trench 46 therein which surrounds via 44. At this point, no new ARC deposition is needed since the affected area is advantageously still generally covered by the combined dielectric spacer layer 42 and underlying DARC silicon oxynitride layer 41 stack arrangement. Although via 44 may initially be partially filled with residual photoresist layer 45 material (not shown), this is removed during the development process for opening trench 46. This is the condition of semiconductor device 40 after the steps [9] to [10] of providing a further photoresist layer on the dielectric spacer layer and in surrounding relation to the previously removed pattern portions of the dielectric spacer layer, and exposing and developing the further photoresist layer to uncover widened pattern portions surrounding the previously removed pattern portions of the dielectric spacer layer.

Figure 2E:
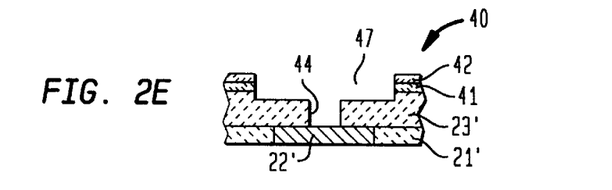

FIG. 2E shows semiconductor device 40 after further dielectric etching of dielectric spacer layer 42, DARC silicon oxynitride layer 41 and the upper course portions of inorganic layer 23' to provide a deepened, yet unwidened, via trench 47 through dielectric spacer layer 42, DARC silicon oxynitride layer 41 and the upper course portions of insulation layer 23' to a desired depth therein. This is followed by stripping of photoresist layer 45. Trench 47 is not widened relative to trench 46 due to the selectivity of the dielectric etch process. Also, no fences are formed in insulation layer 23'. This is the condition of semiconductor device 40 after the step [11] of removing the uncovered widened pattern portions of the dielectric spacer layer and corresponding underlying portions of the DARC silicon oxynitride layer and upper course portions of the underlying widened portions of the insulation layer surrounding the previously uncovered first conductive layer region.

Figure 2F:
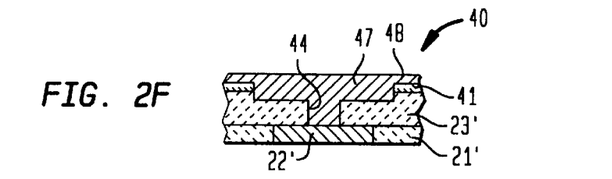

FIG. 2F shows semiconductor device 40 after wet cleaning insulation layer 23', followed by deposition of second level conductive layer 48, e.g., of a metal such as aluminum, on insulation layer 23' which overfills via trench 47 created therein and forms a conductive contact with first level conductive layer 22'. The wet cleaning operation may also remove the dielectric spacer layer 42. In this regard, the nature of dielectric spacer layer 42, especially where composed of SOG material, is such that it generally etches much faster, e.g., in dilute or buffered HF, than commonly denser silicon dioxide in general and silicon oxynitride. This is the condition of semiconductor device 40 after the step [12] of providing a second conductive layer on the widened pattern portions of the insulation layer and in conductive contact with the previously uncovered pattern portions of the first conductive layer region.

Figure 2G:
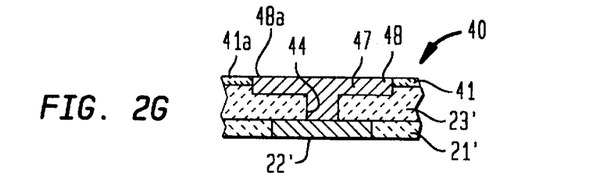

Lastly, FIG. 2G shows semiconductor device 40 after chemical mechanical polishing (CMP) of surplus second level conductive material from second level conductive layer 48 back down to the level of DARC silicon oxynitride layer 41. This forms polished top surface 41a on DARC silicon oxynitride layer 41 and polished top surface 48a on second level conductive layer 48 in flush relation to each other, e.g., with some overpolishing at such top surfaces. Depending on the choice of individual thicknesses for DARC silicon oxynitride layer 41 and dielectric spacer layer 42, these layers may be partially or fully removed by the pertinent wet cleaning and CMP operations.

The steps of providing first level conductive layer 22' on wafer substrate 21', depositing insulation layer 23' on wafer substrate 21', depositing DARC silicon oxynitride layer 41 on insulation layer 23', depositing dielectric spacer layer 42 on DARC silicon oxynitride layer 41, applying photoresist layer 25' on dielectric spacer layer 42, patterning photoresist layer 25', etching dielectric spacer layer 42 and DARC silicon oxynitride layer 41, and etching insulation layer 23', are effected by conventional technique. The further steps of stripping photoresist layer 25' from dielectric spacer layer 42, applying photoresist layer 45 to dielectric spacer layer 42, patterning photoresist layer 45, again etching dielectric spacer layer 42, DARC silicon oxynitride layer 41 and insulation layer 23', stripping photoresist layer 45, wet cleaning insulation layer 23', depositing second level conductive layer 48 on insulation layer 23', and chemically mechanically polishing DARC silicon oxynitride layer 41 and second level conductive layer 48, are also effected by conventional technique.

In particular, wafer substrate 21' may be made of silicon or another material such as a metal. First level conductive layer 22' may be made of, e.g., tungsten and second level conductive layer 48 of, e.g., aluminum. Insulation layer 23' may be made of, e.g., silicon dioxide. It serves as an insulation barrier for first level conductive layer 22'.

Preferably, insulation layer 23' is provided in a thickness of about 5,000–10,000 angstroms, DARC silicon oxynitride layer 41 is provided in a thickness of about 300–1,500 angstroms, and dielectric spacer layer 42 is provided in a thickness of about 250–1,000 angstroms.

The thickness of DARC silicon oxynitride layer 41 is chosen for it to function either in the destructive interference or absorption mode.

The photoresist layers are exposed to UV wave irradiation such as at a wavelength of about 193 to 365 nm.

The above scheme according to the invention which uses an essentially reactive nitrogenous substance-free dielectric spacer layer between a DARC silicon oxynitride layer and a photoresist layer affords better lateral control for the etching operations and provides a thin barrier or shield layer for physically and functionally separating the DARC silicon oxynitride layer from the photoresist layer. This separation inhibits reactive nitrogenous substance transport from the DARC silicon oxynitride layer therethrough so as to prevent such reactive nitrogenous substances from reaching and poisoning the photoresist layer to cause footing or pinching formation.

Also, the dielectric spacer layer is desirably transparent so that the incident light will travel readily therethrough during photoresist exposure for maximum absorption by the DARC silicon oxynitride layer.

These advantages occur while avoiding the prior art width control and fence formation problems connected with use of an organic ARC layer. This is because the organic ARC material cannot be etched by the dielectric material etch, and the latter material cannot be etched by the organic ARC material etch. According to the invention, only dielectric etching is involved and this can be effected by conventional dry etching technique, e.g., by RIE using a fluorine containing chemistry.

An advantage of using DARC silicon oxynitride layer 41 with dielectric spacer layer 42 according to the invention, over the prior art use of an organic ARC layer such as a BARL (bottom antireflective layer), is that the DARC silicon oxynitride layer 41/dielectric spacer layer 42 combination stack can serve to provide a hard mask for subsequent processing. Indeed, a very thin photoresist layer 25' with excellent spacial resolution can be employed to provide selective patterning of dielectric spacer layer 42, followed by stripping of photoresist layer 25', and selective patterning of DARC silicon oxynitride layer 41 using dielectric spacer layer 42 as a hard mask.

In particular, conductive layers 22' and 48, insulation layer 23' and DARC silicon oxynitride layer 41 are typically provided by PECVD technique. Although dielectric spacer layer 42 may be provided by any appropriate technique, including physical or chemical vapor deposition (PVD or CVD), so long as it is formed as a material essentially free from reactive contaminating nitrogenous substances, it is conveniently provided by spin-on technique, e.g., as spin-on glass (SOG), in similar manner to the applying of photoresist layers 25' and 45.

Use of SOG, such as the Dow Corning Co. commercial product "Flowable Oxide," lends itself to integration into existing manufacturing processing schemes and is desirably used according to the invention. Preferred SOG materials include those based on hydrogen silsesquioxane, other siloxanes, and the like, which are baked to remove the solvent and provide the desired glass.

SOG is readily fabricated from Si—O containing precursors in solution, being typically dissolved in an organic solvent. The SOG solution is spin-deposited in equipment similar to tools (tracks) commonly used to apply organic materials such as photoresist and organic ARC materials. The final SOG thickness can be easily controlled via the spin speed and the Si—O based resin solid content. SOG films of excellent uniformity can be deposited at thicknesses of about 250–1,000 angstroms.

SOG materials generally have enhanced wet etch ratios (e.g., >10×) compared to PECVD oxides, due to the reduced mechanical density of SOG as compared to such oxides, e.g., silicon dioxide.

Like the forming of layers of organic materials such as organic ARC and photoresist materials by spin-on technique, the SOG solution also undergoes a series of baking steps (drying bakes) to evaporate the solvent and form the desired Si—O network. The temperature for the SOG bakes is typically about 200–350° C., preferably about 250° C. Specifically, the SOG solution is deposited by spin-on technique at room temperature, then baked initially at about 150° C., and finally at about 250° C., all under inert, i.e., non-reactive, nitrogen, to provide a solid oxide (silicon dioxide based) film which forms dielectric spacer layer 42.

This temperature is higher than that of photoresist bakes, but lower than that of plasma deposition processes. For example, photoresist layers 25' and 45 are typically deposited by spin-on deposition and then baked at 90–150° C. On the other hand, using CVD/PVD and PECVD processing, metals for layers 22' and 48a are deposited at a temperature of up to about 450° C. (per CVD or PVD technique), and dielectrics such as silicon dioxide for layer 23' and DARC silicon oxynitride for layer 41 are deposited at a temperature of about 250–400° C., especially about 350° C. (per PECVD technique).

Although the solid oxide film of SOG produced by baking the spin-on deposited solution is of lower density (and thus more porous) than silicon dioxide deposited by PECVD technique, the freedom from reactive nitrogenous substance contamination of the SOG material in the dielectric spacer layer 42 is what serves to prevent transport of reactive nitrogenous substances from DARC silicon oxynitride layer 41 therethrough to reach photoresist layer 25' or 45, as the case may be. Despite the lower density and more porous nature of the SOG material, it serves as a sufficient physical and functional spacing structure to keep DARC silicon oxynitride layer 41 and its contents away from the interface with photoresist layer 25' or 45.

Reactive mobile nitrogen and nitrogen-containing constituents present in DARC silicon oxynitride layer 41 will migrate therefrom into dielectric spacer layer 42. However, any such reactive contaminating nitrogenous substances traceable to DARC silicon oxynitride layer 41 may be retained in or contained by dielectric spacer layer 42 sufficiently to prevent photoresist poisoning during the time that dielectric spacer layer 42 and photoresist layers 25' and 45, all of which are sacrificial layers, remain in the stack (see FIGS. 2A–2E).

According to the prior art, the DARC silicon oxynitride layer is deposited, e.g., by PECVD, on the wafer substrate to be patterned, and a silicon dioxide cap layer for avoiding direct transport of reactive nitrogenous substances from the DARC silicon oxynitride layer to the overlying photoresist layer, is deposited, e.g., by PECVD, on the DARC silicon oxynitride layer. This tandem deposition of the DARC silicon oxynitride layer and then the silicon dioxide cap layer is effected in one kind of operation, whereas the photoresist layer is thereafter applied, e.g., by spinning technique, on the silicon dioxide cap layer in a different kind of operation, followed by photoresist patterning.

However, according to the prior art, reactive nitrogenous substances that lead to photoresist poisoning and footing problems are inherently present in the DARC silicon oxynitride layer, and usually also in the silicon dioxide cap layer. They are traceable to reactive nitrogenous constituents in the, e.g., PECVD type, deposition process materials such as silane, oxygen, nitrogen, nitrous oxide, etc., the silane contributing hydrogen during formation of, for example, silicon dioxide or silicon oxynitride.

According to the invention, on the other hand, while the DARC silicon oxynitride layer is deposited, e.g., by PECVD, on the wafer substrate to be patterned, in one kind of operation, both the dielectric spacer layer and photoresist layer can be applied in an integrated manner in tandem steps by spin-on technique, in a different kind of operation. The dielectric spacer layer as formed by SOG technique can be versatilely provided in a wide range of thicknesses, and can be applied on tools (tracks) corresponding to those being used in industry for applying deep UV photoresist layers. More specifically, dielectric spacer layer 42 and photoresist layer 25' can be deposited, e.g., by spin-on technique, in sequence onto wafer substrate 21', i.e., onto DARC silicon oxynitride layer 41, in the same deposition zone, i.e., deposition chamber (track).

Thus, compared to the prior art use of a plasma step to deposit a silicon dioxide cap layer on the DARC silicon oxynitride layer, according to the invention there are no required plasma steps after the plasma deposition of DARC silicon oxynitride layer 41. Instead, the SOG deposition of dielectric spacer layer 42 can be effected in inert, i.e., non-reactive, nitrogen, with the use of mild thermal baking of the SOG at temperatures akin to those for applying the photoresist layer. These temperatures are much lower than those for plasma deposition of a silicon dioxide cap layer, and the mild conditions do not result in adverse incorporation of the inert nitrogen into the SOG.

Most significant is the fact that there is no source of contaminating reactive nitrogenous substances such as reactive nitrogen or reactive nitrogen-containing compounds in the normally liquid SOG precursor materials, the SOG production and deposition being carried out in the absence of contaminating reactive nitrogen constituents. Also, a much lower thermal budget is involved since SOG is applied at mild temperatures, e.g., equivalent to those used to apply the photoresist layer by spin-on technique, compared to the high temperatures needed to perform plasma deposition of the usual silicon dioxide cap layer for the DARC silicon oxynitride layer, e.g., by PECVD. The fabrication method according to the invention lends itself to exploitation of selectivities towards both silicon oxynitride and organic source materials for the SOG.

Another advantage of the invention is that, after the pertinent photolithographic operation, the SOG of dielectric spacer layer 42 can be easily stripped in a dual damascene application, e.g., by combining the SOG strip with a buffered HF pre-cleaning step, e.g., prior to a second level metal deposition step.

Although the SOG deposition process is no longer integrated into the DARC silicon oxynitride layer deposition, e.g., per PECVD technique, as in the case of the prior art silicon dioxide cap layer deposition, it is efficiently integrated into the photoresist spin-on operation, thus involving similar costs thereto. In particular, both the SOG and photoresist layers can be deposited in sequence in the same deposition zone (track).

DARC silicon oxynitride layer 41 achieves desired uniform reflectance control for contact photolithographic processing since it is an excellent antireflective material for both MUV (typically of 365 nm wavelength) and DUV (typically of 248 nm or less) photolithographic processing. The silicon oxynitride composition can be adjusted to optimize its antireflective property by suitably changing the composition ratio of the $SiO_xN_y$ components, where x is 0.5–1.5 and y is 0.1–1.5, i.e., $SiO_{0.5-1.5}N_{0.5-1.5}$, for example, per PECVD using silane ($SiH_4$) with nitrous oxide ($N_2O$).

It is noted that said [6] U.S. Pat. No. 5,219,788 (Abernathey et al.), discloses a metal nitride ARC layer of TiN on a metal conductive bilayer on a substrate, and a silicon-containing barrier layer of sputtered silicon or $SiO_2$, or of SOG per said [5] U.S. Pat. No. 4,981,530 (Clodgo et al.), on the TiN ARC layer. The barrier layer is needed to separate the TiN ARC layer from a photoresist layer that generates acid groups on exposure per said [2] U.S. Pat. No. 4,491,628 (Ito et al.), to reduce the resist poisoning effect called "webbing" caused by the TiN ARC layer.

In contrast thereto, according to the invention, in order to perform its physical and functional nitrogenous substance flow-inhibiting effect, the dielectric spacer layer 42 must be free from contaminating reactive nitrogenous substances per se and also those specifically traceable to silicon oxynitride (rather than to TiN) as a DARC material that can potentially poison the photoresist material.

Given its purpose, the dielectric spacer layer 42 is also free from dye as contemplated by said [3] U.S. Pat. No. 4,587,138 (Yau et al.), issued May 6, 1986, i.e., that nullifies the transparency of the SOG material and causes it to function as an ARC layer.

Compared to known use of TiN as a metal nitride ARC material for a metal conductive layer, according to the invention the silicon oxynitride used as the ARC material per DARC silicon oxynitride layer 41 is a true dielectric ARC material which is not restricted to the patterning of metal conductive layers but rather is usable for patterning various other types of layer materials as well.

Accordingly, it can be appreciated that the specific embodiments described are merely illustrative of the general principles of the invention. Various modifications may be provided consistent with the principles set forth.

What is claimed is:

1. A method of forming a patterned conductive multilayer arrangement on a semiconductor substrate comprising the steps of:

providing a dielectric insulation layer on a surface of a semiconductor substrate having a first conductive layer disposed in a selective region thereon such that the insulation layer overlies the region of the first conductive layer;

providing a silicon oxynitride layer on the insulation layer sufficiently to form a dielectric antireflective coating thereon;

providing an essentially reactive nitrogenous substance-free dielectric spacer layer on the antireflective coating silicon oxynitride layer sufficiently to prevent reactive nitrogenous substance transport therethrough from the silicon oxynitride layer;

providing a photoresist layer on the dielectric spacer layer;

selectively exposing and developing the photoresist layer to uncover selective pattern portions of the underlying dielectric spacer layer, which pattern portions are in overlying relation to the first conductive layer region in the substrate;

removing the uncovered pattern portions of the dielectric spacer layer and corresponding underlying portions of the silicon oxynitride layer for uncovering corresponding portions of the underlying insulation layer; and removing the uncovered portions of the insulation layer to uncover corresponding portions of the region of the first conductive layer in the substrate.

2. The method of claim 1 wherein the insulation layer is formed of silicon dioxide, and the first conductive layer is formed of metal.

3. The method of claim 1 wherein the dielectric spacer layer is formed of essentially reactive nitrogenous substance-free silicon dioxide material, and the photoresist layer is formed of an organic photoresist material susceptible to reactive nitrogenous substance poisoning.

4. The method of claim 1 wherein the uncovered pattern portions of the dielectric spacer layer and corresponding underlying portions of the silicon oxynitride layer are removed together in a first etching step in an etching chamber, and the uncovered portions of the insulation layer are removed in a second etching step immediately following the first etching step in the same etching chamber.

5. The method of claim 4 wherein the first etching step and second etching step are dry etching steps.

6. The method of claim 1 further including the steps of:

removing the remainder of the developed photoresist layer to expose the dielectric spacer layer;

providing a further photoresist layer on the dielectric spacer layer and in overlying relation to the previously removed pattern portions of the dielectric spacer layer;

selectively exposing and developing the further photoresist layer to uncover further pattern portions surrounding the previously removed pattern portions of the dielectric spacer layer;

removing the uncovered further pattern portions of the dielectric spacer layer and corresponding underlying portions of the silicon oxynitride layer and upper portions of the underlying corresponding further portions of the insulation layer surrounding the previously uncovered pattern portions of the first conductive layer region; and providing a second conductive layer on the further pattern portions of the insulation layer and in conductive contact with the previously uncovered pattern portions of the first conductive layer region.

7. The method of claim 6 wherein the insulation layer is formed of silicon dioxide, and the first and second conductive layers are respectively formed of metal.

8. The method of claim 6 wherein the dielectric spacer layer is formed of essentially reactive nitrogenous substance-free silicon dioxide material, and the photoresist layer is formed of an organic photoresist material susceptible to reactive nitrogenous substance poisoning.

9. The method of claim 8 wherein the dielectric spacer layer is formed of essentially reactive nitrogenous substance-free spin-on glass.

10. The method of claim 1 wherein the insulation layer is provided in a thickness of 5,000–10,000 angstroms, the silicon oxynitride layer is provided in a thickness of 300–1,500 angstroms, and the dielectric spacer layer is provided in a thickness of 250–1,000 angstroms.

11. The method of claim 1 wherein the dielectric spacer layer and the photoresist layer are provided by deposition in sequence onto the antireflective silicon oxynitride layer in the same deposition chamber.

12. A method of forming a patterned conductive multilayer arrangement on a semiconductor substrate comprising the steps of:

providing a dielectric insulation layer on a surface of a semiconductor substrate having a first conductive layer disposed in a selective region thereon such that the insulation layer overlies the region of the first conductive layer;

providing a silicon oxynitride layer on the insulation layer sufficiently to form a dielectric antireflective coating thereon;

providing an essentially reactive nitrogenous substance-free dielectric spacer layer on the antireflective coating silicon oxynitride layer sufficiently to prevent reactive nitrogenous substance transport therethrough from the silicon oxynitride layer;

providing a photoresist layer on the dielectric spacer layer;

selectively exposing and developing the photoresist layer to uncover selective pattern portions of the underlying dielectric spacer layer, which pattern portions are in overlying relation to the first conductive layer region in the substrate;

removing the uncovered pattern portions of the dielectric spacer layer and corresponding underlying portions of the silicon oxynitride layer for uncovering corresponding portions of the underlying insulation layer; and removing the uncovered portions of the insulation layer to uncover corresponding portions of the region of the first conductive layer in the substrate;

the dielectric spacer layer being formed of essentially reactive nitrogenous substance-free spin-on glass, and the photoresist layer being formed of an organic photoresist material susceptible to reactive nitrogenous substance poisoning.

13. The method of claim 12 wherein the dielectric spacer layer and the photoresist layer are provided by deposition in sequence onto the antireflective silicon oxynitride layer in the same deposition chamber.

14. A method of treating a wafer substrate in semiconductor fabrication for inhibiting reactive nitrogenous substance flow from a silicon oxynitride layer forming a dielectric antireflective coating thereon to an overlying photoresist layer to prevent reactive nitrogenous substance poisoning of the photoresist layer, which comprises interposing an essentially reactive nitrogenous substance-free dielectric spacer layer between the silicon oxynitride layer and the overlying photoresist layer sufficiently to prevent reactive nitrogenous substance transport therethrough from the dielectric antireflective coating silicon oxynitride layer to the photoresist layer.

15. The method of claim 14 wherein the dielectric spacer layer is formed of essentially reactive nitrogenous substance-free silicon dioxide material, and the photoresist layer is formed of an organic photoresist material susceptible to reactive nitrogenous substance poisoning.

16. The method of claim 14 wherein the dielectric spacer layer and the photoresist layer are provided by deposition in sequence onto the antireflective silicon oxynitride layer in the same deposition chamber.

17. A method of treating a wafer substrate in semiconductor fabrication for inhibiting reactive nitrogenous substance flow from a silicon oxynitride layer forming a dielectric antireflective coating thereon to an overlying photoresist layer to prevent reactive nitrogenous substance poisoning of the photoresist layer, which comprises interposing an essentially reactive nitrogenous substance-free dielectric spacer layer between the silicon oxynitride layer and the overlying photoresist layer sufficiently to prevent reactive nitrogenous substance transport therethrough from the dielectric antireflective coating silicon oxynitride layer to the photoresist layer;

the dielectric spacer layer being formed of essentially reactive nitrogenous substance-free spin-on glass, and the photoresist layer being formed of an organic photoresist material susceptible to reactive nitrogenous substance poisoning.

18. The method of claim 17 wherein the dielectric spacer layer and the photoresist layer are provided by deposition in sequence onto the antireflective silicon oxynitride layer in the same deposition chamber.

* * * * *